(12) United States Patent
Suzuki et al.

(10) Patent No.: US 7,492,011 B2
(45) Date of Patent: Feb. 17, 2009

(54) SEMICONDUCTOR DEVICE AND MANUFACTURING METHOD OF SEMICONDUCTOR DEVICE

(75) Inventors: Teruo Suzuki, Kasugai (JP); Kenji Hashimoto, Kawasaki (JP); Toshio Nomura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 439 days.

(21) Appl. No.: 11/273,400

(22) Filed: Nov. 15, 2005

(65) Prior Publication Data

US 2006/0273398 A1  Dec. 7, 2006

(30) Foreign Application Priority Data

Jun. 2, 2005 (JP) .............................. 2005-162834

(51) Int. Cl.
*H01L 23/62* (2006.01)
(52) U.S. Cl. ....................... 257/355; 257/358; 257/360; 257/E21.619; 257/E29.176; 438/224; 438/309
(58) Field of Classification Search ................. 257/173, 257/355, 360; 438/224, 309
See application file for complete search history.

(56) References Cited

U.S. PATENT DOCUMENTS

| 5,874,763 | A | * | 2/1999 | Ham ........................... 257/360 |
| 6,897,536 | B2 | * | 5/2005 | Nomura et al. ............. 257/403 |
| 2006/0001097 | A1 | * | 1/2006 | Nomura et al. ............. 257/355 |

FOREIGN PATENT DOCUMENTS

| JP | 2002-134630 | 5/2002 |
| JP | 2004-15003 | 1/2004 |

* cited by examiner

*Primary Examiner*—Dao H. Nguyen
(74) *Attorney, Agent, or Firm*—Westerman, Hattori, Daniels & Adrian, LLP.

(57) ABSTRACT

To present a semiconductor device mounting ESD protective device appropriately applicable to transistors mutually different in dielectric strength, and its manufacturing method. The semiconductor device comprises a first ESD protective circuit 1A including a first transistor 3 and a first ballast resistance 4, and a second ESD protective circuit 1B including a second transistor 5 and a second ballast resistance 6. The impurity concentration of the second diffusion region forming the first ballast resistance 4 is set lower than the impurity concentration of the fourth diffusion region for forming the second ballast resistance 6.

7 Claims, 7 Drawing Sheets

AA SECTIONAL VIEW OF STRUCTURE OF FIRST ESD PROTECTIVE CIRCUIT IN EMBODIMENT

AA SECTIONAL VIEW OF STRUCTURE OF SECOND ESD PROTECTIVE CIRCUIT IN EMBODIMENT

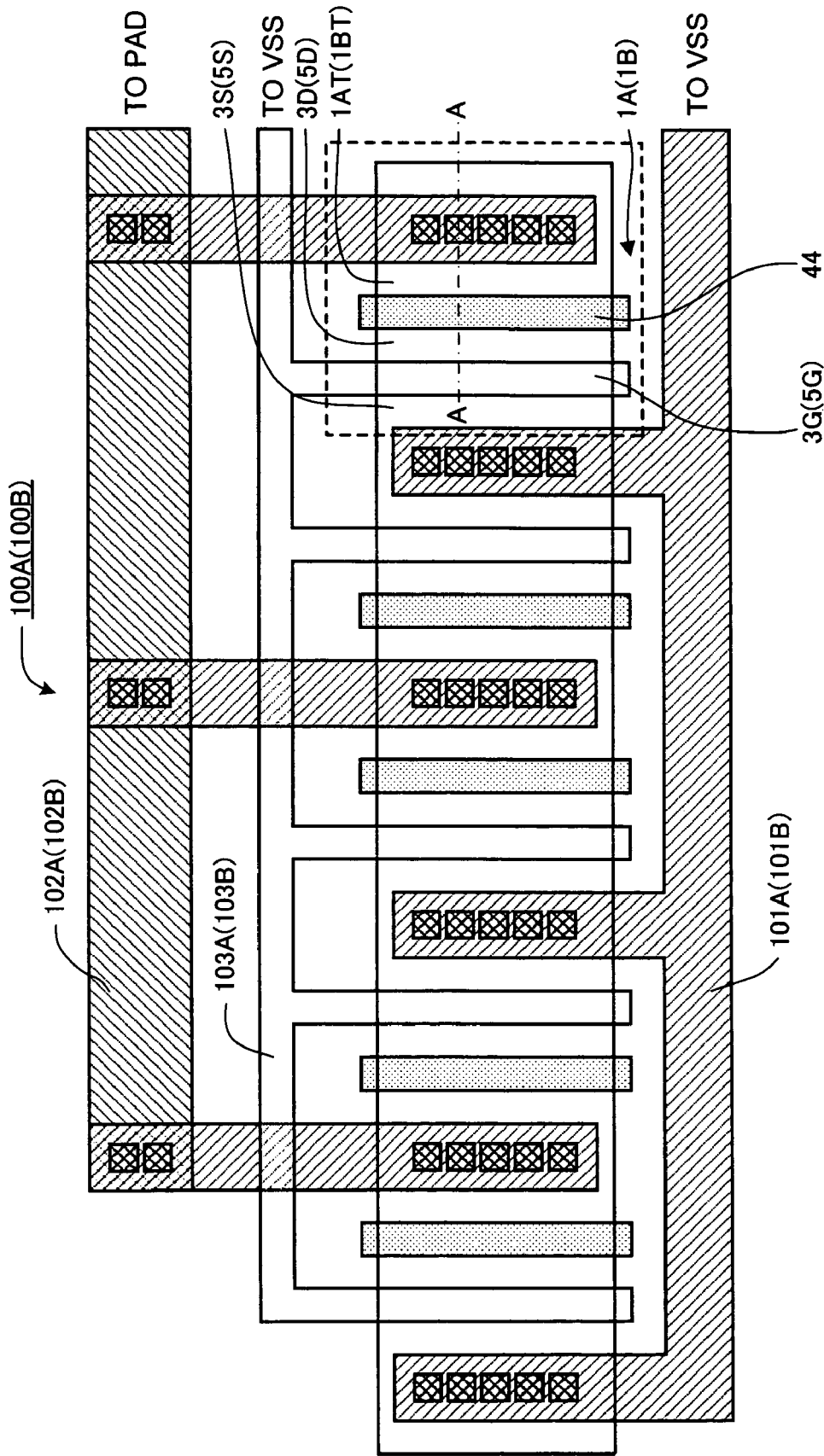
FIG. 1 LAYOUT OF ESD PROTECTIVE CIRCUIT IN EMBODIMENT

AA SECTIONAL VIEW OF STRUCTURE OF FIRST ESD PROTECTIVE CIRCUIT IN EMBODIMENT

AA SECTIONAL VIEW OF STRUCTURE OF SECOND ESD PROTECTIVE CIRCUIT IN EMBODIMENT

VOLTAGE-CURRENT CHARACTERISTIC OF FIRST ESD PROTECTIVE CIRCUIT(FOR 3.3V)

VOLTAGE-CURRENT CHARACTERISTIC OF SECOND ESD PROTECTIVE CIRCUIT(FOR 1.2V)

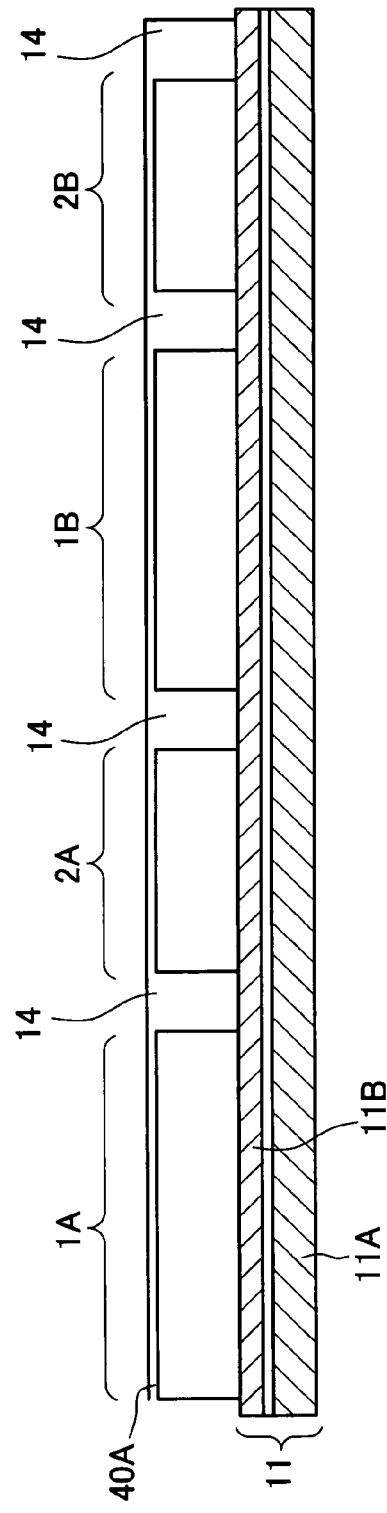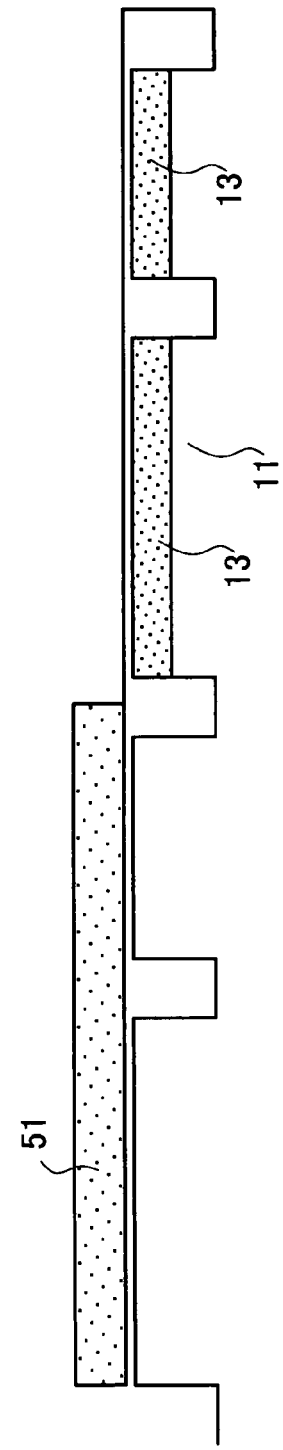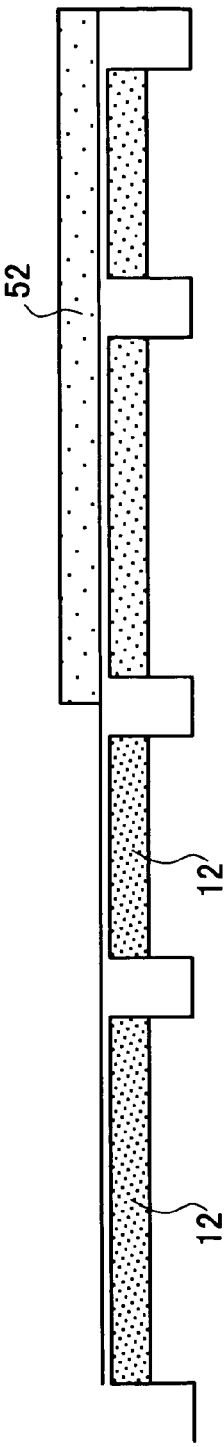

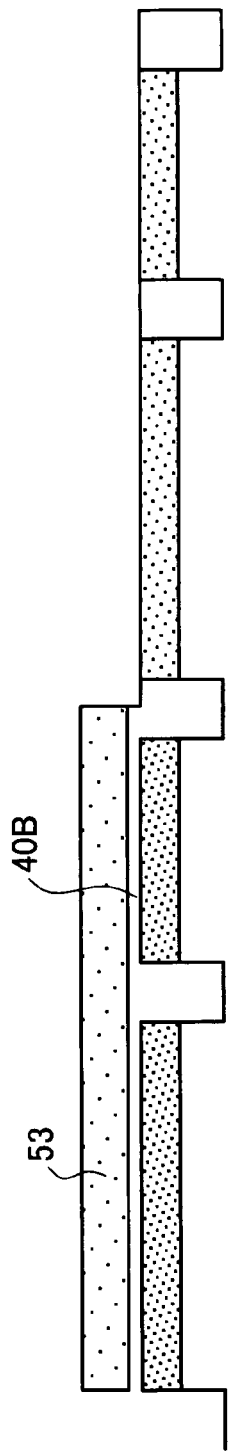
FIG. 5D SECTIONAL VIEW OF MANUFACTURING PROCESS OF SEMICONDUCTOR DEVICE IN EMBODIMENT
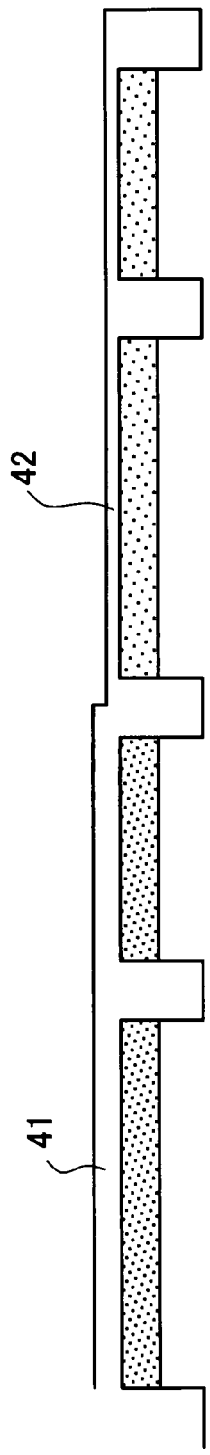
FIG. 5E SECTIONAL VIEW OF MANUFACTURING PROCESS OF SEMICONDUCTOR DEVICE IN EMBODIMENT
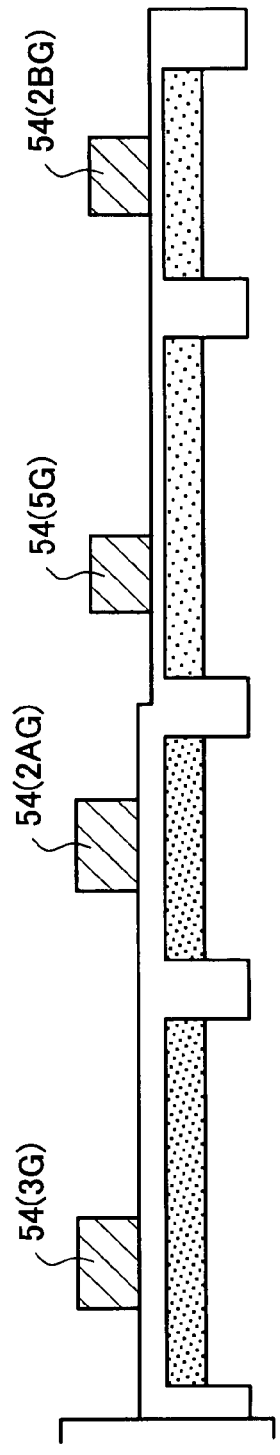
FIG. 5F SECTIONAL VIEW OF MANUFACTURING PROCESS OF SEMICONDUCTOR DEVICE IN EMBODIMENT

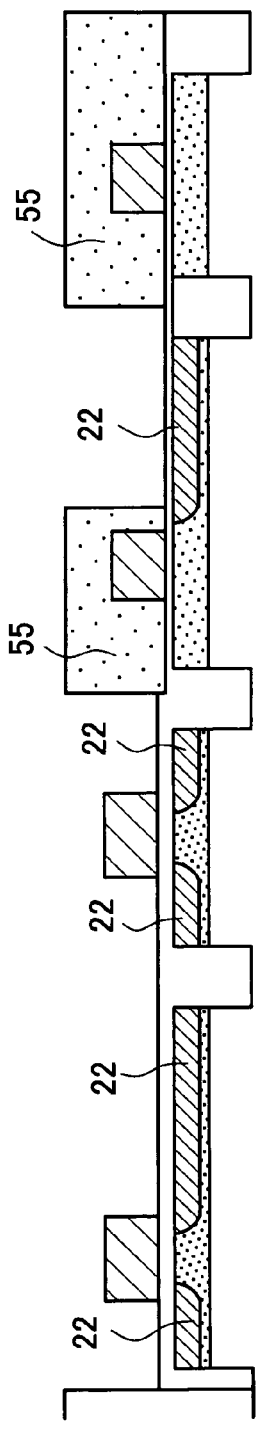
FIG. 6G SECTIONAL VIEW OF MANUFACTURING PROCESS OF SEMICONDUCTOR DEVICE IN EMBODIMENT
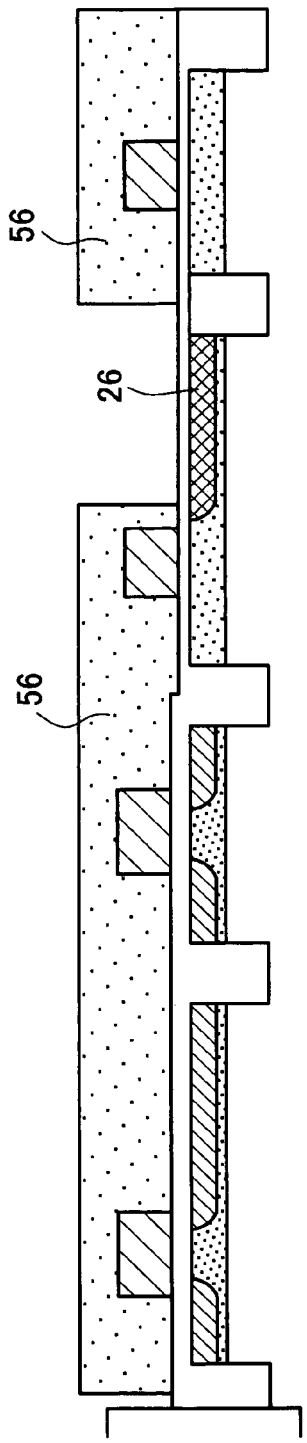
FIG. 6H SECTIONAL VIEW OF MANUFACTURING PROCESS OF SEMICONDUCTOR DEVICE IN EMBODIMENT
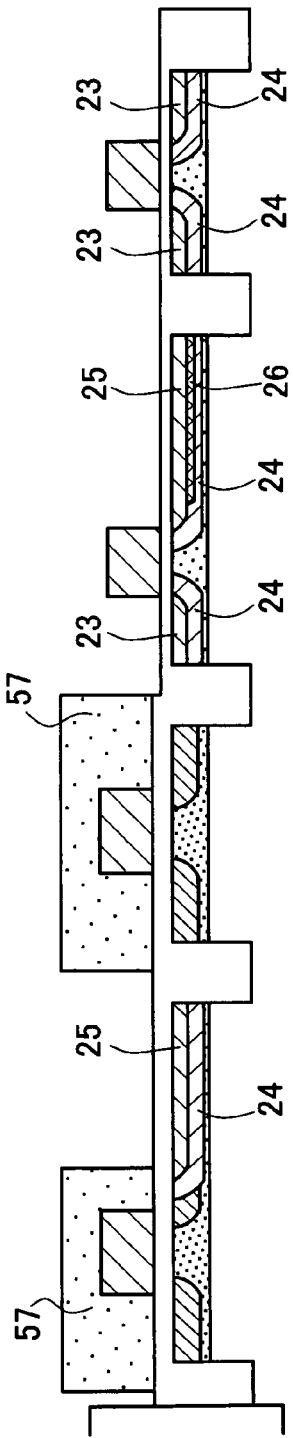
FIG. 6I SECTIONAL VIEW OF MANUFACTURING PROCESS OF SEMICONDUCTOR DEVICE IN EMBODIMENT

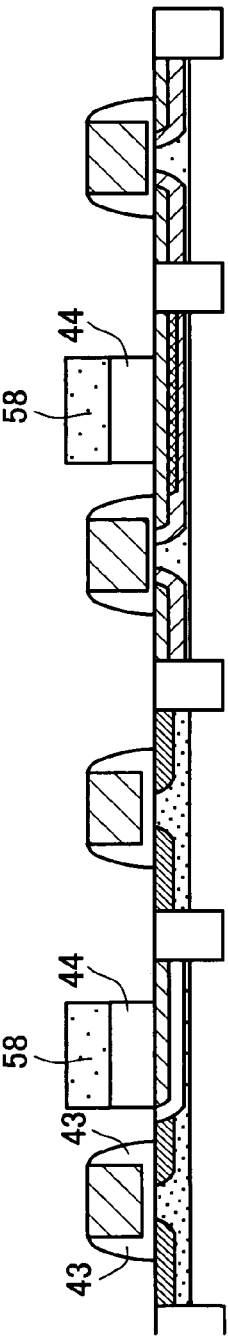
FIG. 7J SECTIONAL VIEW OF MANUFACTURING PROCESS OF SEMICONDUCTOR DEVICE IN EMBODIMENT
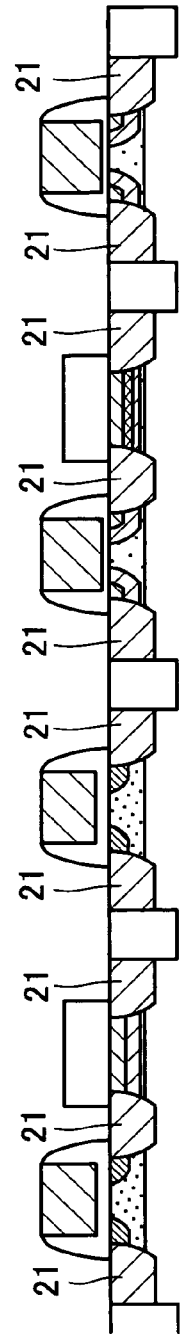
FIG. 7K SECTIONAL VIEW OF MANUFACTURING PROCESS OF SEMICONDUCTOR DEVICE IN EMBODIMENT
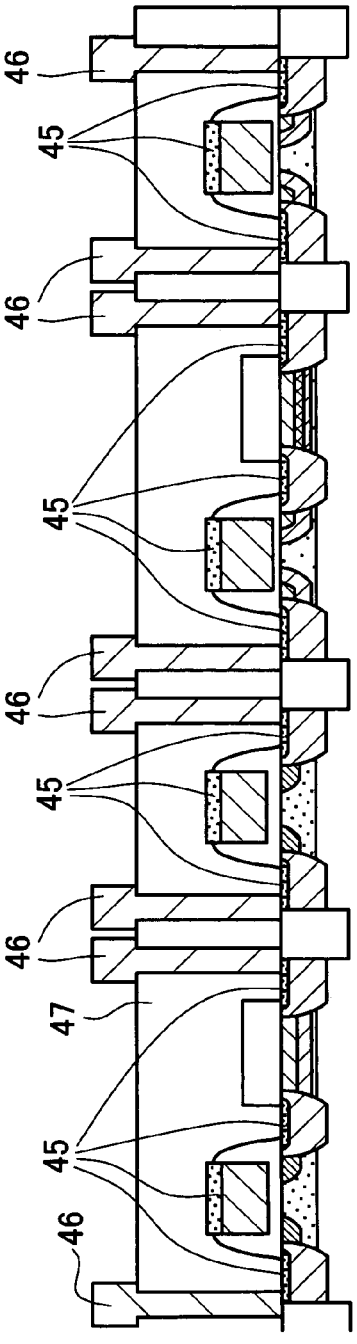
FIG. 7L SECTIONAL VIEW OF MANUFACTURING PROCESS OF SEMICONDUCTOR DEVICE IN EMBODIMENT

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from each of the prior Japanese Patent Application No. 2005-162834 filed on Jun. 2, 2005, the entire contents of which are incorporated herein by reference.

BACKGROUND OF THE INVENTION

1. Field of the Invention

The present invention relates to a semiconductor device, and more particularly to a semiconductor device including an ESD protective circuit for enhancing tolerance to electrostatic discharge breakdown and its manufacturing method.

2. Description of the Related Art

As an ESD protective circuit for enhancing tolerance to an electrostatic discharge (ESD) breakdown in a semiconductor device, an ESD protective circuit shown in FIG. 1 of Japanese unexamined patent application publication No. 2004-15003 is used. This ESD protective circuit includes an NMOS transistor (hereinafter called transistor) having the source electrode connected to a grounding potential and the drain electrode connected to a fetch terminal. The voltage surge applied to the fetch terminal is discharged to the grounding potential by way of a lateral bipolar transistor parasitizing in this transistor.

To cope with discharge current of large voltage surge, an ESD protective circuit having a finger structure shown in FIG. 4 and FIG. 5 of Japanese unexamined patent application publication No. 2004-15003 is devised. In this ESD protective circuit, a plurality of transistors is connected in parallel. Since the discharge current can be divided and distributed into transistors, large discharge current of voltage surge can be released. In each transistor, a ballast resistance is connected in series. This ballast resistance is used in the ESD protective circuit of the finger structure for the purpose of preventing other transistors from failing to conduct when one transistor conducts to lower the voltage of the fetch terminal.

FIG. 1 of Japanese unexamined patent application publication No. 2002-134630 discloses a layout structure of a semiconductor device including such ballast resistance. This semiconductor device comprises a high concentration impurity diffusion layer 29 (drain electrode), a high concentration impurity diffusion layer for fetch 29e (signal fetch terminal), and a protective resistance region 31 enclosed by them. On the surface of the high concentration impurity diffusion layer 29 and high concentration impurity diffusion layer for fetch 29e, a metal silicide layer 33 is formed. On the other hand, on the surface of the protective resistance region 31, a mask layer 28 formed of silicon nitride film is formed. Accordingly, between the high concentration impurity diffusion layer 29 and high concentration impurity diffusion layer for fetch 29e, the metal silicide layer 33 is cut off on the surface of the protective resistance region 31. Therefore, the high concentration impurity diffusion layer 29 and high concentration impurity diffusion layer for fetch 29e are connected electrically only by way of the protective resistance region 31, they can be connected at high resistance.

SUMMARY OF THE INVENTION

In recent semiconductor devices, meanwhile, in the micronizing trend, the supply voltage is often lowered from the conventional level of 3.3 V to 1.2 V. However, many of the circuits connected to the semiconductor device are still designed to interface by conventional input and output signals at 3.3 V. Accordingly, a semiconductor device may comprise internal core circuits designed at supply voltage of 1.2 V, and input and output circuits designed at supply voltage of 3.3 V. As a result, the semiconductor device has transistors mutually different in dielectric strength. Therefore, the ESD protective circuit applicable to transistors mutually different in dielectric strength is installed in the semiconductor device.

When such ESD protective circuit applicable to transistors mutually different in dielectric strength is installed, and in the case of the ESD protective circuit of the finger structure, the resistance value of the ballast resistance may be set depending on the dielectric strength of the transistor. For example, in the ESD protective circuit applicable to transistors with dielectric strength of 1.2 V (or ESD protective circuit for 1.2 V), depending on the thickness of a gate oxide film of the transistor, inclination of PN junction concentration of a back gate electrode and drain electrode is designed in a steep characteristic. Accordingly, the parasitizing lateral bipolar transistor is likely to conduct. Therefore, if the resistance value of the ballast resistance is lowered, other transistors in the finger structure can conduct. To the contrary, if the resistance value of the ballast resistance is high, the voltage of a fetch terminal is likely to elevate, possibly becoming higher than the withstand voltage of the transistor, and the transistor may be broken down.

On the other hand, in the ESD protective circuit applicable to input and output signals of 3.3 V (or ESD protective circuit for 3.3 V), as compared with the ESD protective circuit for 1.2 V, the parasitizing lateral bipolar transistor is hardly controlled in conduction. Hence, when the resistance value of the ballast resistance is lowered, some of other transistors in the finger structure may fail to conduct. Therefore, the ballast resistance of the ESD protective circuit for 3.3 V must be set higher than the ballast resistance of the ESD protective circuit for 1.2 V.

To compose ESD protective circuits mutually having ballast resistance of different resistance values, for example, the layout of a region of protective resistance in each ESD protective circuit may be changed. For instance, when changed to the layout of a small width, a ballast resistance of the high resistance value may be formed.

However, when the layout is changed, the number of processes of the layout design is increased, and effects on layout size are caused, and problems are involved.

The invention is devised to solve at least one of the problems of the background art, and it is hence an object thereof to present a semiconductor device mounting an ESD protective device appropriately applicable to transistors mutually different in dielectric strength by minimizing the number of processes of the layout design and effects on the layout size and semiconductor process, and a method of manufacturing the same.

To achieve the object above, there is provided a semiconductor device including ESD protective circuits for enhancing a tolerance to an electrostatic discharge breakdown, comprising: a substrate of a first conductive type, a first region forming a plurality of first ESD protective circuits in a finger structure, and a second region forming a plurality of second ESD protective circuits in the finger structure, wherein each of the first ESD protective circuits includes: a first transistor having a first gate electrode, and a first drain electrode including a first diffusion region of a second conductive type, and a first ballast resistance including a second diffusion region of the second conductive type connected to the first diffusion region in a direction apart from the first gate electrode, with an impurity concentration lower than the concentration of the first diffusion region, and each of the second ESD protective circuits includes: a second transistor having a second gate electrode, and a second drain electrode including a third diffusion region of the second conductive type, having dielectric strength lower than that of the first transistor, and a second ballast resistance including a fourth diffusion region of the second conductive type connected to the third diffusion region in a direction apart from the second gate electrode, with the impurity concentration higher than the concentration of the second diffusion region.

Other solving means is a manufacturing method of the semiconductor device as set forth in claim 1, being a manufacturing method of the semiconductor device comprising a step of forming the fourth diffusion region by implanting a first impurity element of the second conductive type selectively in the second ballast resistance, and a step of forming the second diffusion region by implanting a second impurity element of the second conductive type at least in the first ballast resistance after forming the fourth diffusion region.

In the semiconductor device and its manufacturing method of the invention, since the second ballast resistance includes the fourth diffusion region which is higher in concentration than the second diffusion region, its resistance is lower than that of the first ballast resistance. That is, without changing the layout, resistance values of the first ballast resistance and second ballast resistance are varied, and ESD protective circuits appropriately applicable to mutually different transistors can be formed.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 1 is a plan view of a layout of an ESD protective circuit in an embodiment;

FIG. 4A is a sectional view of a manufacturing process of a semiconductor device in the embodiment;

FIG. 4B is a sectional view of the manufacturing process of the semiconductor device in the embodiment;

FIG. 4C is a sectional view of the manufacturing process of the semiconductor device in the embodiment;

FIG. 5D is a sectional view of the manufacturing process of the semiconductor device in the embodiment;

FIG. 5E is a sectional view of the manufacturing process of the semiconductor device in the embodiment;

FIG. 5F is a sectional view of the manufacturing process of the semiconductor device in the embodiment;

FIG. 6G is a sectional view of the manufacturing process of the semiconductor device in the embodiment;

FIG. 6H is a sectional view of the manufacturing process of the semiconductor device in the embodiment;

FIG. 6I is a sectional view of the manufacturing process of the semiconductor device in the embodiment;

FIG. 7J is a sectional view of the manufacturing process of the semiconductor device in the embodiment;

FIG. 7K is a sectional view of the manufacturing process of the semiconductor device in the embodiment; and FIG. 7L is a sectional view of the manufacturing process of the semiconductor device in the embodiment.

DETAILED DESCRIPTION OF THE PREFERRED EMBODIMENTS

Preferred embodiments of a semiconductor device of the invention are specifically described below while referring to FIG. 1 to FIG. 7.

Figure 2A:
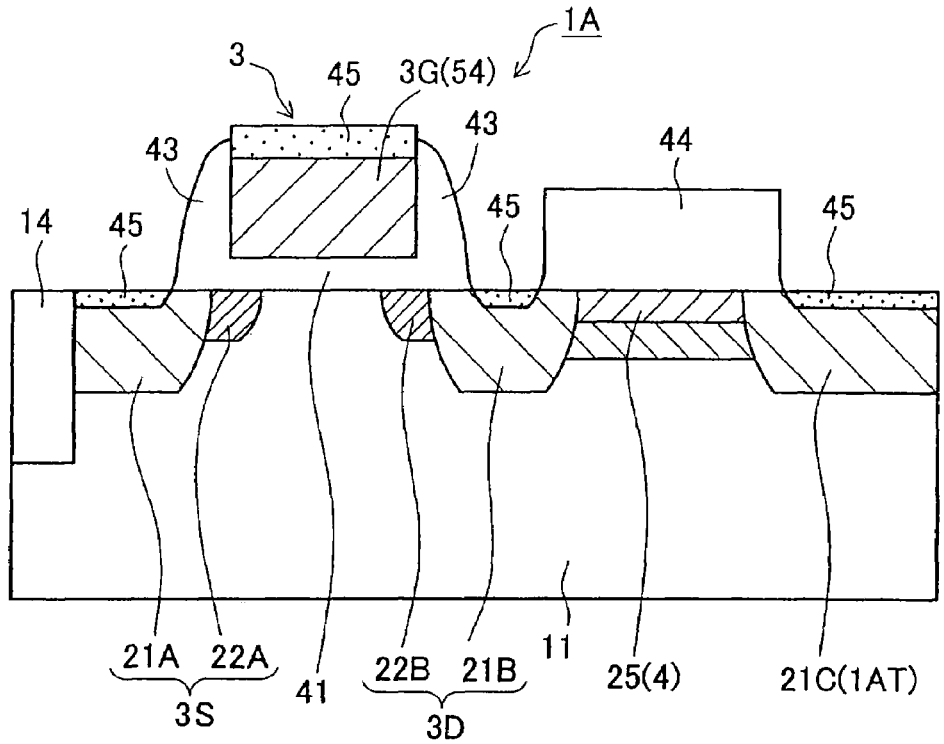
FIG. 2A is an AA sectional view of a structure of a first ESD protective circuit in the embodiment.
Figure 2B:
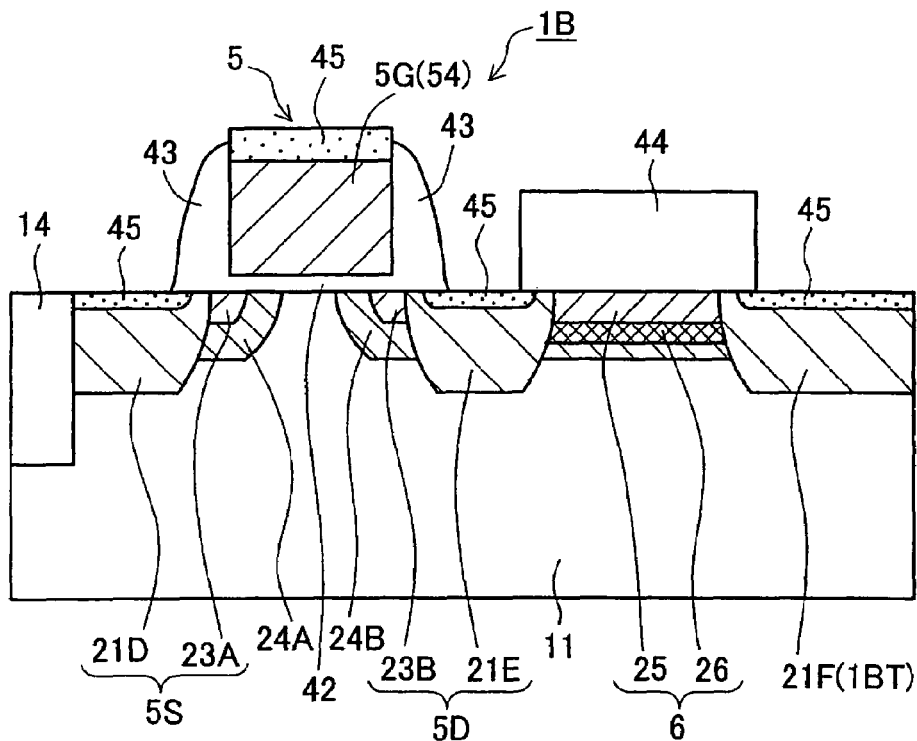
FIG. 2B is an AA sectional view of a structure of a second ESD protective circuit in the embodiment.

First, a preferred embodiment of an ESD protective circuit is explained in FIG. 1, FIG. 2A, and FIG. 2B.

The semiconductor device of the embodiment comprises a first region 100A of first ESD protective circuits 1A shown in FIG. 1 formed in a finger structure, and a second region 100B of second ESD protective circuits 1B formed in the finger structure.

The first region 100A includes the five first ESD protective circuits 1A. The first ESD protective circuit 1A has a source electrode 3S, a gate electrode 3G, and a silicide block 44, and the source electrode 3S and the gate electrode 3G are connected to a grounding potential VSS by way of metal wiring 101A and poly wiring 103A, respectively. A fetch terminal 1AT is connected to an external pad (not shown) of the semiconductor device by way of metal wiring 102A.

The second region 100B has a same structure as the first region 100A. Therefore, reference numerals of the parts of the second region 100B are given in parentheses in FIG. 1, and explanation is omitted.

FIG. 2A and FIG. 2B are AA sectional views showing the structure of the first ESD protective circuit 1A as the ESD protective circuit for 3.3 V and the second ESD protective circuit 1B as the ESD protective circuit for 1.2 V. FIG. 2A shows the first ESD protective circuit 1A, and FIG. 2B shows the second ESD protective circuit 1B.

The first ESD protective circuit 1A shown in FIG. 2A has a first transistor 3 and a first ballast resistance 4.

The first transistor 3 consists of the source electrode 3S composed of a n-type diffusion region 21A and a first LDD region 22A, a drain electrode 3D composed of a n-type diffusion region 21B and a first LDD region 22B, and the gate electrode 3G composed of polysilicon 54. The gate electrode 3G is opposite to a p-type substrate 11 forming a back gate electrode across a gate oxide film 41 of 18 nm in thickness. The side of the gate electrode 3G is covered with a side wall spacer 43 which is integral with the gate oxide film 41. The surface of the source electrode 3S, the drain electrode 3D and the source electrode 3S is covered with a silicide layer 45, and the transmission impedance is lowered.

On the other hand, the first ballast resistance 4 is composed of a n-type diffusion region 25, and both ends are connected to n-type diffusion region 21B and a n-type diffusion region 21C. On the top of the n-type diffusion region 25, the silicide block 44 composed of oxide insulating matter is disposed to cut off conduction with the silicide layer 45 disposed on the top of the n-type diffusion regions 21B, 21C. Accordingly, the n-type diffusion layer 21B, and the n-type diffusion layer 21C forming the fetch terminal 1AT conduct with each other by way of the first ballast resistance 4.

In this embodiment, the n-type diffusion region 25 is formed by implanting ions also in the n-type diffusion region 25 when forming first LDD regions 22A, 22B, and second LDD regions 23A, 23B as described below. The impurity concentration of the LDD region is lower than the concentration of the n-type diffusion regions 21B, 21C for forming the source-drain region. Therefore, the impurity concentration of the n-type diffusion region 25 is lower than the concentration of the n-type diffusion regions 21B, 21C.

The second ESD protective circuit 1B shown in FIG. 2B is formed in the p-type substrate 11, and has a second transistor 5 and a second ballast resistance 6. Same as the first ESD protective circuit 1A, it is isolated from other circuits by STI region 14.

The second transistor 5 consists of a source electrode 5S composed of a n-type diffusion region 21D and a second LDD region 23A, a drain electrode 5D composed of a n-type diffusion region 21E and the second LDD region 23B, and a gate electrode 5G composed of the polysilicon 54. The gate electrode 5G is opposite to the p-type substrate 11 forming a back gate electrode across a gate oxide film 42 of 8 nm in thickness. This gate oxide film 42 is thinner than the gate oxide film 41 of the first transistor 3, and the dielectric strength of the gate oxide film of the second transistor 5 is lower than the dielectric strength of the gate oxide film of the first transistor 3. The side of the gate electrode 5G is covered with a side wall spacer 43 which is integral with the gate oxide film 42. The second transistor 5 has a DILDD (double implanted LDD) structure, and p-type pocket regions 24A, 24B of higher concentration than impurity concentration of the p-type substrate 11 are disposed between the second LDD regions 23A, 23B and the p-type substrate 11. Same as in the first ESD protective circuit 1A, the surface of the gate electrode 5G, the drain electrode 5D, and source electrode 3S is covered with the silicide layer 45.

On the other hand, the second ballast resistance 6 is composed of the n-type diffusion region 25 and a n-type diffusion region 26, and both ends are connected to the n-type diffusion region 21E and a n-type diffusion region 21F. On the top of the n-type diffusion region 25, the silicide block 44 composed of oxide insulating matter is disposed to cut off conduction with the silicide layer 45 disposed on the top of the n-type diffusion regions 21E, 21F. Accordingly, the n-type diffusion region 21E, and the n-type diffusion region 21F forming a fetch terminal 1BT conduct with each other by way of the second ballast resistance 6.

The n-type diffusion region 26 has a higher impurity concentration than the impurity concentration of the n-type diffusion region 25. Accordingly, the sheet resistance of the second ballast resistance 6 is lower than the resistance value of the first ballast resistance 4. Hence, when the first ballast resistance 4 and second ballast resistance 6 are formed in similar shape, the resistance value of the second ballast resistance 6 can be set lower than the resistance value of the first ballast resistance 4.

The p-type is an example of a first conductive type, the n-type is an example of a second conductive type, the n-type diffusion region 21B is an example of a first diffusion region, the n-type diffusion region 25 of FIG. 2A is an example of a second diffusion region, the n-type diffusion region 21E is an example of a third diffusion region, the n-type diffusion region 26 is an example of a fourth diffusion region, the n-type diffusion region 25 of FIG. 2B is an example of a fifth diffusion region, and the second LDD region 23B is an example of the LDD region.

Figure 3A:
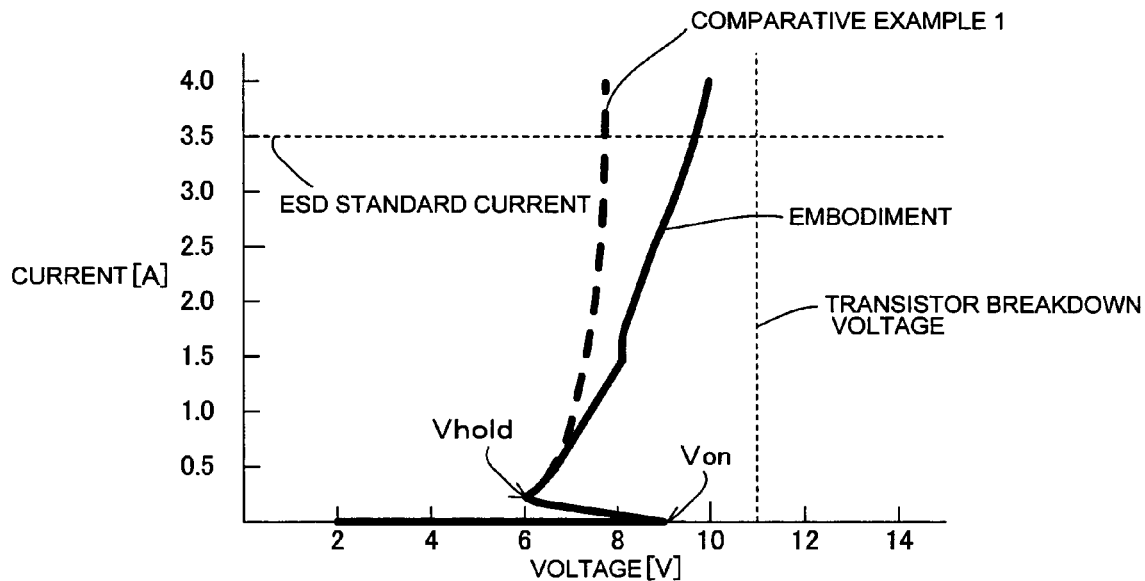
FIG. 3A is a graph of a voltage-current characteristic of the first ESD protective circuit (for 3.3V) in the embodiment.
Figure 3B:
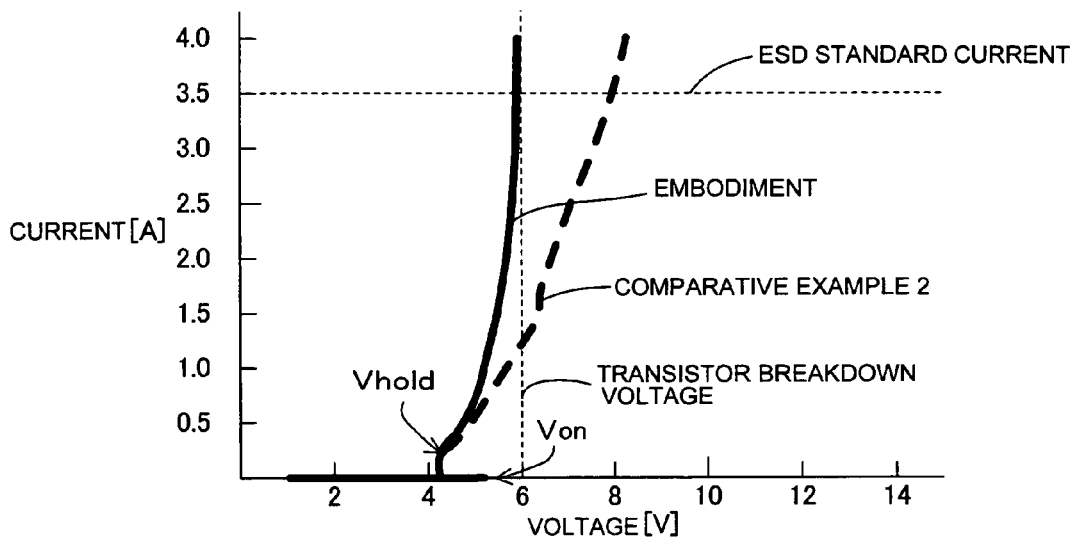
FIG. 3B is a graph of the voltage-current characteristic of the second ESD protective circuit (for 1.2V) in the embodiment.

FIG. 3A and FIG. 3B show voltage-current characteristics of the first ESD protective circuit 1A and the second ESD protective circuit 1B of the embodiment. FIG. 3A is the characteristic of the first ESD protective circuit 1A, and FIG. 3B is the characteristic of the second ESD protective circuit 1B. The both characteristics show the measured values of voltage and current in the fetch terminal 1AT (1BT) in test conditions of a machine model (applied voltage 200 V) of an ESD dielectric strength standard (JEDEC specification). In the test of the ESD dielectric strength standard, it is required that current of 3.5 A or more should be passed in a range of a voltage value not exceeding the transistor breakdown voltage.

In FIG. 3A, the voltage-current characteristic of the first ESD protective circuit 1A of the embodiment is indicated by solid line. The axis of abscissas denotes the voltage value of the fetch terminal 1AT, and the axis of ordinates represents the current value flowing into the fetch terminal 1AT.

First, when the voltage of the fetch terminal 1AT climbs up, the lateral bipolar transistor parasitizing in the first transistor 3 conducts. As a result, the voltage of the fetch terminal 1AT begins to decline, and the current starts to flow (the portion of switch voltage Von (about 9 V in this example) in the diagram).

As the current increases, voltage drop occurs in the first ballast resistance 4, and the voltage of the fetch terminal 1AT begins to rise again (the portion of hold voltage Vhold (about 6 V in this example) in the diagram). Inclination of an elevation of this voltage value depends on the resistance value of the first ballast resistance 4. In the first ESD protective circuit 1A, since the first ballast resistance 4 is set at high resistance, the voltage elevation inclination is relatively moderate.

Accordingly, before the current value reaches 3.5 A, it reaches the switch voltage Von again, and in the first ESD protective circuit 1A of the finger structure, other lateral bipolar transistor than the one already conducing is to conduct. That is, in the first ESD protective circuit 1A of the embodiment, the current is dispersed among a plurality of the first transistors 3, and concentration of current in one first transistor 3 is prevented, so that its breakdown is avoided.

In FIG. 3B, the voltage-current characteristic of the second ESD protective circuit 1B of the embodiment is indicated by solid line. The axis of abscissas denotes the voltage value of the fetch terminal 1BT, and the axis of ordinates represents the current value flowing into the fetch terminal 1BT.

The second ESD protective circuit 1B, like the first ESD protective circuit 1A, has the characteristic of the voltage descending at switch voltage Von and voltage ascending at hold voltage Vhold.

Accordingly, the 1.2 V transistor to be protected by the second ESD protective circuit 1B is lower in the limit value of the transistor breakdown voltage than the 3.3 V transistor (6 V in this example).

In the second ESD protective circuit 1B, hence, the resistance value of the second ballast resistance 6 is set low. Therefore, as shown in FIG. 3B, the voltage-current characteristic shows a steep inclination as compared with that of the first ESD protective circuit 1A. As a result, without surpassing the limit value of the transistor breakdown voltage, a current of 3.5 A is allowed to flow in the fetch terminal 1B.

COMPARATIVE EXAMPLE 1

The dotted line in FIG. 3A shows the characteristic of the first ESD protective circuit 1A when the resistance value of the first ballast resistance 4 is set same as the resistance value of the second ballast resistance 6. In the ESD protective circuit of a comparative example 1, the inclination of the voltage-current characteristic is steep as compared with that of the first ESD protective circuit 1A, and the voltage of the fetch terminal 1AT will not reach the switch voltage Von. Hence, while no ESD protective element is turned on, the current flows in lateral bipolar transistors parasitizing in few first transistors 3, so that breakdown may occur before flow of 3.5 A.

COMPARATIVE EXAMPLE 2

The dotted line in FIG. 3B shows the characteristic of the second ESD protective circuit 1B when the resistance value of the second ballast resistance 6 is set same as the resistance value of the first ballast resistance 4. In the ESD protective circuit of a comparative example 2, the inclination of the voltage-current characteristic is moderate as compared with that of the second ESD protective circuit 1B, and the voltage may exceed the limit value of the transistor breakdown voltage before the current reaches 3.5 A. Hence in the internal core circuits, transistors of low dielectric strength may be broken down.

Troubles occur in both comparative example 1 and comparative example 2 where the first ballast resistance 4 and second ballast resistance 6 are identical in the resistance value.

By contrast, in the invention, the first ballast resistance 4 and second ballast resistance 6 can be set properly depending on the dielectric resistance of the transistors, and an ESD protective circuit operating appropriately can be composed.

A manufacturing method of the semiconductor device mounting the first ESD protective circuit 1A and the second ESD protective circuit 1B is explained by referring to FIG. 4 to FIG. 7.

The semiconductor device in this embodiment comprises a third transistor 2A and a fourth transistor 2B used in ordinary circuit, aside from the first ESD protective circuit 1A and the second ESD protective circuit 1B. The third transistor 2A is same as the first transistor 3 included in the first ESD protective circuit 1A, and the fourth transistor 2B is same as the second transistor 5 included in the second ESD protective circuit 1B.

In the following explanation, by way of comparison, the manufacturing process of the third transistor 2A and the fourth transistor 2B is also described. FIG. 4A shows the forming region of the first ESD protective circuit 1A, the third transistor 2A, the second ESD protective circuit 1B, and the fourth transistor 2B.

First, as shown in FIG. 4A, the surface of the p-type substrate 11 forming STI region 14 is thermally oxidized by known method, and an oxide film 40 is grown in a thickness of 10 nm.

Further, forming a resist mask (not shown) for exposing the NMOS transistor forming region (entire surface in FIG. 4A), B+ ions are implanted at acceleration energy of 300 KeV, and dose of $3.0 \times 10^{13}$ cm$^{-1}$, and a p-type region 11A is formed.

Moreover, B+ ions are implanted at acceleration energy of 100 KeV, and dose of $2.0 \times 10^{12}$ cm$^{-2}$, and a p-type region 11B is formed. Later, the resist mask is removed. In the following explanation, the formed p-type regions 11A, 11B are omitted in the drawing.

Next, as shown in FIG. 4B, a resist mask 51 is formed for exposing the regions of the second ESD protective circuit 1B and the fourth transistor 2B, and B+ ions are implanted at acceleration energy of 10 KeV, and dose of $4.5 \times 10^{12}$ cm$^{-2}$, and a p-type region 13 is formed. Then the resist mask 51 is removed.

Successively, as shown in FIG. 4C, a resist mask 52 is formed for exposing the regions of the first ESD protective circuit 1A and the third transistor 2A, and B+ ions are implanted at acceleration energy of 30 KeV, and dose of $5.0 \times 10^{12}$ cm$^{-2}$, and a p-type region 12 is formed. Then the resist mask 52 is removed.

The oxide film 40A of 10 nm formed on the surface of the p-type substrate 11 explained in FIG. 4A is removed, and an oxide film 40B of 7.2 nm is grown on the entire surface by thermal oxidation method. Further, as shown in FIG. 5D, a resist mask 53 is formed for exposing the regions of the second ESD protective circuit 1B and the fourth transistor 2B, and the oxide film 40B in the exposed portion is removed. Then the resist mask 53 is removed.

As shown in FIG. 5E, an oxide film of 1.8 nm is grown on the entire surface by thermal oxidation method. As a result, in the regions of the first ESD protective circuit 1A and the third transistor 2A, the gate oxide film 41 of 8 nm is formed, and a gate oxide film 42 of 1.8 nm is formed in region C and region D.

By CVD method, the polysilicon 54 is formed on the entire surface. Further, as shown in FIG. 5F, gate electrodes 3G, 2AG, 5G, 2BG are formed for the first transistor 3, the third transistor 2A, the second transistor 5, and the fourth transistor 2B, respectively, by photolithographic technology.

As shown in FIG. 6G, a resist mask 55 is formed for exposing the regions of the first ESD protective circuit 1A, the third transistor 2A and second ballast resistance 6, and P+ ions are implanted at high inclination angle of 20 degrees to 45 degrees in the condition of acceleration energy of 35 KeV and dose of $1.0 \times 10^{13}$ cm$^{-2}$. Then the resist mask 55 is removed.

By this process, n-type diffusion regions 22 are formed in the source electrodes and the drain electrodes of the first transistor 3 and the third transistor 2A, and the first ballast resistance 4 and second ballast resistance 6. Part of the source electrodes and the drain electrodes of these transistors forms an LDD region.

As shown in FIG. 6H, a resist mask 56 is formed for exposing the region of the second ballast resistance 6, and P+ ions (first impurity elements) are implanted at acceleration energy of 30 KeV, and dose of $1.3 \times 10^{14}$ cm$^{-2}$, and an n-type diffusion region 26 is formed. Then the resist mask 56 is removed.

As shown in FIG. 6I, a resist mask 57 is formed for exposing the first ballast resistance 4, the second ESD protective circuit 1B and the fourth transistor 2B, and As+ ions (second impurity elements) are implanted at acceleration energy of 3 KeV, and dose of $1.0 \times 10^{15}$ cm$^{-2}$, and a second LDD region 23 and the n-type diffusion region 25 (fourth diffusion region) are formed. Further, BF2+ ions are implanted at acceleration energy of 35 KeV, and dose of $1.0 \times 10^{13}$ cm$^{-2}$, and a p-type pocket region 24 is formed. Then the resist mask 57 is removed.

As a result, in the region of the first ballast resistance 4, the n-type diffusion region 25 and p-type pocket region 24 are laminated and formed in this order from the side closer to the surface of the p-type substrate 11. On the other hand, in the region of the second ballast resistance 6, the n-type diffusion region 25, n-type diffusion region 26, and p-type pocket region 24 are laminated and formed in this order from the side closer to the surface of the p-type substrate 11.

On the entire surface, an oxide film of 130 nm is grown by CVD method. As shown in FIG. 7J, a resist mask 58 is formed for exposing other area than the silicide block 44, and the oxide film on the surface is removed by anisotropic etching method. As a result, the side wall spacer 43 for the silicide block 44 and each gate electrode are formed.

As shown in FIG. 7K, a resist mask not shown is formed for exposing the transistor, and P+ ions are implanted at acceleration energy of 15 KeV, and dose of $7.0\times10^{15}$ cm$^{-2}$, and an n-type diffusion region 21 is formed. Then the resist mask is removed. Further in nitrogen atmosphere at 1000° C., impurities are activated by high speed heat treatment for 10 seconds. By this process, the n-type diffusion regions for the source electrodes and the drain electrodes of the transistors are formed.

As shown in FIG. 7L, silicide layers 45 are formed by known methods on source electrodes, drain electrodes and gate electrodes of transistors. Further, an insulating film 47 is grown, and contact holes and wirings 46 are formed, and finally a semiconductor device is completely manufactured.

In the manufacturing method of the semiconductor device of the embodiment, in the process shown in FIG. 6H, the n-type diffusion region 26 of low resistance can be selectively formed on the second ballast resistance 6.

In the manufacturing method of the semiconductor device of the embodiment, in the process shown in FIG. 6I, the n-type diffusion region 25 is formed together with the second LDD region 23 of the second transistor 5. That is, in the invention, the process of forming the n-type diffusion region 25 and the process of forming the second LDD region 23 are combined in one process, and hence the number of processes is curtailed as compared with the manufacturing method of separate ion implantation processes when forming the first ballast resistance 4 and the second ballast resistance 6.

When forming the n-type diffusion region 25 of the first ballast resistance 4, for example, by skipping ion implantation when forming the n-type diffusion region 22 shown in FIG. 6G, ions may be implanted only on the n-type diffusion region 25 of the first ballast resistance 4 when forming the n-type diffusion region 25 in FIG. 6I. To the contrary, ions may be implanted only on the n-type diffusion region 25 of the first ballast resistance 4 when forming the n-type diffusion region 22. In either case, the resistance value of the n-type diffusion region 25 is higher than the resistance value in the embodiment. That is, by thus changing the ion implantation process, the resistance value of the first ballast resistance 4 can be adjusted.

The invention is not limited to the embodiment alone, but may be variously changed and modified within the scope not departing from the true spirit of the invention.

In the embodiment, as for the dielectric strength of the gate oxide film, the second transistor 5 is lower in dielectric strength than the first transistor 3, but concerning the dielectric strength of junction parts of the substrate electrode and the drain electrode, the invention is applicable also if one transistor is lower in dielectric strength than other transistor.

In the embodiment, the semiconductor device having STI structure is shown, but the invention is also applied in the semiconductor device having the conventional LOCOS structure.

In the embodiment, the semiconductor device having a general silicide block structure is shown, but the invention may be also applied in the semiconductor device having silicide block structures of various forms as shown, for example, in FIG. 26 of patent document 1.

In the embodiment, the ESD protective circuit composed of transistor alone is explained, but the invention is similarly applied to the ESD protective circuits having cascade structure as shown, for example, in FIG. 6 of patent document 1.

The invention is thus applied and hence presents a semiconductor device mounting ESD protective circuits applicable to transistors mutually different in dielectric strength, by minimizing effects on layout design, layout size, and semiconductor manufacturing process, and its manufacturing method.

What is claimed is:

1. A semiconductor device including ESD protective circuits for enhancing a tolerance to an electrostatic discharge breakdown, comprising:
   a substrate of a first conductive type,
   a first region forming a plurality of first ESD protective circuits in a finger structure, and
   a second region forming a plurality of second ESD protective circuits in the finger structure,
   wherein each of the first ESD protective circuits includes:
   a first transistor having a first gate electrode, and a first drain electrode including a first diffusion region of a second conductive type, and
   a first ballast resistance including a second diffusion region of the second conductive type connected to the first diffusion region in a direction apart from the first gate electrode, with an impurity concentration lower than the concentration of the first diffusion region, and
   each of the second ESD protective circuits includes:
   a second transistor having a second gate electrode, and a second drain electrode including a third diffusion region of the second conductive type, having dielectric strength of a gate oxide lower than that of the first transistor, and
   a second ballast resistance including a fourth diffusion region of the second conductive type connected to the third diffusion region in a direction apart from the second gate electrode, with the impurity concentration higher than the concentration of the second diffusion region.

2. The semiconductor device of claim 1,
   wherein the second ballast resistance includes a fifth diffusion region with the impurity concentration same as concentration of the second diffusion region.

3. The semiconductor device of claim 2,
   wherein the fourth diffusion region is disposed in a direction apart from the surface of the substrate further than the fifth diffusion region.

4. The semiconductor device of claim 1,
   wherein the second drain electrode of the second transistor has an LDD region, and
   the second diffusion region has the impurity concentration same as or higher than the concentration of the LDD region.

5. A manufacturing method of the semiconductor device of claim 1, comprising:
   a step of forming the fourth diffusion region by implanting a first impurity element of the second conductive type selectively in the second ballast resistance, and
   a step of forming a second diffusion region by implanting a second impurity element of the second conductive type at least in the first ballast resistance after forming the fourth diffusion region.

6. The manufacturing method of semiconductor device of claim 5,
   wherein the second drain electrode of the second transistor has the LDD region, and
   the step of forming the second diffusion region serves also as a step of implanting the second impurity element of the second conductive type in the LDD region.

7. The manufacturing method of semiconductor device of claim 5,
   wherein the step of forming the second diffusion region serves also as a step of implanting the second impurity element of the second conductive type also in the second ballast resistance.

* * * * *